United States Patent
Prasad

(10) Patent No.: US 6,295,287 B1
(45) Date of Patent: *Sep. 25, 2001

(54) REVERSE-LINK INTERLEAVING FOR COMMUNICATION SYSTEMS BASED ON CLOSED-FORM EXPRESSIONS

(75) Inventor: Mohit K. Prasad, Bethlelem, PA (US)

(73) Assignee: Agere System Guardian Corp., Orlando, FL (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/039,157

(22) Filed: Mar. 13, 1998

(51) Int. Cl.$^7$ ...................................... H04J 13/00
(52) U.S. Cl. ................ 370/342; 370/235; 370/335; 370/441; 370/479
(58) Field of Search ................... 370/203, 320, 370/335, 342, 441, 487, 538, 235; 375/130, 295, 135; 455/403, 422, 456

(56) References Cited

U.S. PATENT DOCUMENTS

| | | | |
|---|---|---|---|
| 4,199,660 | 4/1980 | Dill et al. | 370/50 |
| 4,633,486 * | 12/1986 | Berlekamp et al. | 375/116 |
| 4,742,517 | 5/1988 | Takagi et al. | 371/2 |
| 5,418,813 | 5/1995 | Schaffner et al. | 375/205 |
| 5,673,291 | 9/1997 | Dent | 375/262 |
| 5,675,344 * | 10/1997 | Tong et al. | 455/456 |
| 5,812,543 | 9/1998 | Sugita | 370/335 |
| 5,946,356 * | 8/1999 | Felix et al. | 375/295 |
| 5,949,796 * | 9/1999 | Kumar | 370/487 |
| 6,005,855 * | 12/1999 | Zehavi et al. | 370/335 |
| 6,064,664 | 5/2000 | Kim | 370/335 |
| 6,185,200 * | 2/2001 | Prasad | 370/342 |
| 6,195,344 * | 2/2001 | Prasad | 370/335 |
| 6,198,732 * | 3/2001 | Prasad | 370/335 |
| 6,198,733 * | 3/2001 | Prasad | 370/342 |

OTHER PUBLICATIONS

"Realization of Optimum Interleavers", by John Ramsey, IEEE Transactions on Information Theory, vol. IT–16, No. 3, May 1970, pp. 337–345.

* cited by examiner

*Primary Examiner*—Douglas Olms
*Assistant Examiner*—Shick Hom
(74) *Attorney, Agent, or Firm*—Steve Mendelsohn

(57) ABSTRACT

Interleaving of reverse-link channels is performed by implementing closed-form expressions that are equivalent to the table-based processing specified in the cdmaOne telecommunication specification. The implementation can be in either hardware or software or a combination of both. For each cdmaOne reverse-link channel, the closed-form expression relates each un-interleaved symbol position to a corresponding interleaved symbol position, which is used to generate an interleaved symbol stream from the un-interleaved symbol stream. In one hardware implementation, the reverse-link interleaver of the present invention has an address generation unit made from a modulo counter, five muxes, a multiplier, and an adder.

27 Claims, 3 Drawing Sheets

FIG. 1

| | | | | | | | | | | | | | | | | | |
|---|---|---|---|---|---|---|---|---|---|---|---|---|---|---|---|---|---|
| 1 | 33 | 65 | 97 | 129 | 161 | 193 | 225 | 257 | 289 | 321 | 353 | 385 | 417 | 449 | 481 | 513 | 545 |
| 2 | 34 | 66 | 98 | 130 | 162 | 194 | 226 | 258 | 290 | 322 | 354 | 386 | 418 | 450 | 482 | 514 | 546 |
| 3 | 35 | 67 | 99 | 131 | 163 | 195 | 227 | 259 | 291 | 323 | 355 | 387 | 419 | 451 | 483 | 515 | 547 |
| 4 | 36 | 68 | 100 | 132 | 164 | 196 | 228 | 260 | 292 | 324 | 356 | 388 | 420 | 452 | 484 | 516 | 548 |
| 5 | 37 | 69 | 101 | 133 | 165 | 197 | 229 | 261 | 293 | 325 | 357 | 389 | 421 | 453 | 485 | 517 | 549 |
| 6 | 38 | 70 | 102 | 134 | 166 | 198 | 230 | 262 | 294 | 326 | 358 | 390 | 422 | 454 | 486 | 518 | 550 |
| 7 | 39 | 71 | 103 | 135 | 167 | 199 | 231 | 263 | 295 | 327 | 359 | 391 | 423 | 455 | 487 | 519 | 551 |
| 8 | 40 | 72 | 104 | 136 | 168 | 200 | 232 | 264 | 296 | 328 | 360 | 392 | 424 | 456 | 488 | 520 | 552 |
| 9 | 41 | 73 | 105 | 137 | 169 | 201 | 233 | 265 | 297 | 329 | 361 | 393 | 425 | 457 | 489 | 521 | 553 |
| 10 | 42 | 74 | 106 | 138 | 170 | 202 | 234 | 266 | 298 | 330 | 362 | 394 | 426 | 458 | 490 | 522 | 554 |
| 11 | 43 | 75 | 107 | 139 | 171 | 203 | 235 | 267 | 299 | 331 | 363 | 395 | 427 | 459 | 491 | 523 | 555 |
| 12 | 44 | 76 | 108 | 140 | 172 | 204 | 236 | 268 | 300 | 332 | 364 | 396 | 428 | 460 | 492 | 524 | 556 |
| 13 | 45 | 77 | 109 | 141 | 173 | 205 | 237 | 269 | 301 | 333 | 365 | 397 | 429 | 461 | 493 | 525 | 557 |
| 14 | 46 | 78 | 110 | 142 | 174 | 206 | 238 | 270 | 302 | 334 | 366 | 398 | 430 | 462 | 494 | 526 | 558 |
| 15 | 47 | 79 | 111 | 143 | 175 | 207 | 239 | 271 | 303 | 335 | 367 | 399 | 431 | 463 | 495 | 527 | 559 |
| 16 | 48 | 80 | 112 | 144 | 176 | 208 | 240 | 272 | 304 | 336 | 368 | 400 | 432 | 464 | 496 | 528 | 560 |
| 17 | 49 | 81 | 113 | 145 | 177 | 209 | 241 | 273 | 305 | 337 | 369 | 401 | 433 | 465 | 497 | 529 | 561 |
| 18 | 50 | 82 | 114 | 146 | 178 | 210 | 242 | 274 | 306 | 338 | 370 | 402 | 434 | 466 | 498 | 530 | 562 |
| 19 | 51 | 83 | 115 | 147 | 179 | 211 | 243 | 275 | 307 | 339 | 371 | 403 | 435 | 467 | 499 | 531 | 563 |
| 20 | 52 | 84 | 116 | 148 | 180 | 212 | 244 | 276 | 308 | 340 | 372 | 404 | 436 | 468 | 500 | 532 | 564 |
| 21 | 53 | 85 | 117 | 149 | 181 | 213 | 245 | 277 | 309 | 341 | 373 | 405 | 437 | 469 | 501 | 533 | 565 |
| 22 | 54 | 86 | 118 | 150 | 182 | 214 | 246 | 278 | 310 | 342 | 374 | 406 | 438 | 470 | 502 | 534 | 566 |
| 23 | 55 | 87 | 119 | 151 | 183 | 215 | 247 | 279 | 311 | 343 | 375 | 407 | 439 | 471 | 503 | 535 | 567 |
| 24 | 56 | 88 | 120 | 152 | 184 | 216 | 248 | 280 | 312 | 344 | 376 | 408 | 440 | 472 | 504 | 536 | 568 |
| 25 | 57 | 89 | 121 | 153 | 185 | 217 | 249 | 281 | 313 | 345 | 377 | 409 | 441 | 473 | 505 | 537 | 569 |
| 26 | 58 | 90 | 122 | 154 | 186 | 218 | 250 | 282 | 314 | 346 | 378 | 410 | 442 | 474 | 506 | 538 | 570 |
| 27 | 59 | 91 | 123 | 155 | 187 | 219 | 251 | 283 | 315 | 347 | 379 | 411 | 443 | 475 | 507 | 539 | 571 |
| 28 | 60 | 92 | 124 | 156 | 188 | 220 | 252 | 284 | 316 | 348 | 380 | 412 | 444 | 476 | 508 | 540 | 572 |
| 29 | 61 | 93 | 125 | 157 | 189 | 221 | 253 | 285 | 317 | 349 | 381 | 413 | 445 | 477 | 509 | 541 | 573 |
| 30 | 62 | 94 | 126 | 158 | 190 | 222 | 254 | 286 | 318 | 350 | 382 | 414 | 446 | 478 | 510 | 542 | 574 |
| 31 | 63 | 95 | 127 | 159 | 191 | 223 | 255 | 287 | 319 | 351 | 383 | 415 | 447 | 479 | 511 | 543 | 575 |
| 32 | 64 | 96 | 128 | 160 | 192 | 224 | 256 | 288 | 320 | 352 | 384 | 416 | 448 | 480 | 512 | 544 | 576 |

…

REVERSE-LINK INTERLEAVING FOR COMMUNICATION SYSTEMS BASED ON CLOSED-FORM EXPRESSIONS

CROSS-REFERENCES TO RELATED APPLICATIONS

This application is one of the following five U.S. patent applications filed on the same date: Ser. Nos. 09/039,151, 09/092,397, 09/039,157, 09/039,158 and 09/039,154, the teachings of all of which are incorporated herein by reference.

BACKGROUND OF THE INVENTION

1. Field of the Invention

The present invention relates to telecommunication systems conforming to the cdmaOne standard.

2. Description of the Related Art

The cdmaOne™ communication standard is an interim standard for mobile telecommunication systems in which communications to and from each mobile unit are supported by one of a set of base stations strategically located over the system coverage area. The cdmaOne standard specifies a common air interface for code division multiple access (CDMA) systems on the cellular (900 MHz) and the PCS (1900 MHz) bands for mobile telephony. In addition, the same air interface is used for different wireless loop equipment supplied by a significant number of manufacturers. The term "cdmaOne" is used to refer collectively to the IS-95, IS-95A, and IS-95B family of communication standards.

The cdmaOne standard specifies that the symbols encoded in both the forward-link signal transmitted from the base station to the mobile unit and the reverse-link signal transmitted from the mobile unit to the base station be interleaved in the signal stream. Interleaving is performed to make burst errors during transmission look like random errors that are separated from one another in the de-interleaved symbol stream. In that case, the decoder in a receiver can perform error correction to reconstruct the original symbol stream notwithstanding the presence of burst errors.

According to the cdmaOne standard, a mobile unit transmits reverse-link data on an Access channel at 4800 bps and four Traffic (or Fundamental) channels at 9600, 4800, 2400, and 1200 bps. Each frame in a reverse-link channel contains 576 symbols. At 9600 bps, each symbol occurs once per frame. At 4800 bps, each symbol occurs two times in a row; four times at 2400 bps; and eight times at 1200 bps. The data rates of 9600, 4800, 2400, and 1200 bps correspond to the set of four unpunctured rates under the cdmaOne standard referred to as Rate Set 1.

The cdmaOne standard also supports a second set of data rates referred to as Rate Set 2. In Rate Set 2, punctured convolutional codes are used to transmit data at 14400, 7200, 3600, and 1800 bps, corresponding to the unpunctured rates of 9600, 4800, 2400, and 1200 bps, respectively. By using punctured convolutional codes, the number of symbols per frame is maintained, and the interleaving structure for the four rates of Rate Set 2 is the same as the interleaving structure for the four rates of Rate Set 1.

The cdmaOne standard specifies the reverse-link interleaving process at the mobile unit by means of a table. FIG. 1 shows the order in which the 576 symbols of each un-interleaved frame of reverse-link data may be sequentially (or linearly) arranged within a matrix of 32 rows and 18 columns in the mobile unit. The symbols are written columnnwise, beginning with the first column on the left, successively from the top row to the bottom row. The interleaving process involves reading the rows of the matrix in FIG. 1 (left to right) in a specified order. For the Access channel at 4800 bps, the rows are read in the following sequence:

1 17 9 25 5 21 13 29 3 19 11 27 7 23 15 31 2 18 10 26 6 22 14 30 4 20 12 28 8 24 16 32

For the Traffic channel at 9600 bps (or 14400 bps, if the Rate Set 2 option is activated), the rows are read in the following sequence:

1 2 3 4 5 6 7 8 9 10 11 12 13 14 15 16 17 18 19 20 21 22 23 24 25 26 27 28 29 30 31 32

For the Traffic channel at 4800 bps (or 7200 bps, if the Rate Set 2 option is activated), the rows are read in the following sequence:

1 3 2 4 5 7 6 8 9 11 10 12 13 15 14 16 17 19 18 20 21 23 22 24 25 27 26 28 29 31 30 32

For the Traffic channel at 2400 bps (or 3600 bps, if the Rate Set 2 option is activated), the rows are read in the following sequence:

1 5 2 6 3 7 4 8 9 13 10 14 11 15 12 16 17 21 18 22 19 23 20 24 25 29 26 30 27 31 28 32

For the Traffic channel at 1200 bps (or 1800 bps, if the Rate Set 2 option is activated), the rows are read in the following sequence:

1 9 2 10 3 11 4 12 5 13 6 14 7 15 8 16 17 25 18 26 19 27 20 28 21 29 22 30 23 31 24 32

The cdmaOne standard specifies that the reverse-link interleaving process be implemented using a table-based procedure that can be implemented at a reasonable cost only in software.

SUMMARY OF THE INVENTION

The present invention is directed to an interleaving process for cdmaOne base stations in which the reverse-link symbol stream is interleaved by hardware and/or software that implements closed-form expressions corresponding to the table-based procedure specified in the cdmaOne standard.

According to one embodiment, a closed-form expression relating each un-interleaved symbol position in an un-interleaved symbol stream to a corresponding interleaved symbol position is used to generate an interleaved symbol position for each symbol in the un-interleaved symbol stream. An interleaved symbol stream is generated from the un-interleaved symbol stream using the interleaved symbol positions.

In one hardware implementation, the present invention is an integrated circuit having an interleaver for interleaving a reverse-link channel of a cdmaOne communication system. The interleaver comprises a symbol buffer and an address generation unit. The address generation unit is adapted to generate symbol addresses for reading un-interleaved symbols from or writing interleaved symbols to the symbol buffer. For each channel to be interleaved, the address generation unit implements a closed-form expression relating each un-interleaved symbol position to a corresponding interleaved symbol position to generate an interleaved symbol position for each symbol in the un-interleaved symbol stream.

BRIEF DESCRIPTION OF THE DRAWINGS

Other aspects, features, and advantages of the present invention will become more fully apparent from the following detailed description, the appended claims, and the accompanying drawings in which:

FIG. 1 shows the order in which the 576 symbols of each frame of un-interleaved reverse-link data are arranged in a matrix of 32 rows and 18 columns during the interleaving operation in a cdmaOne mobile unit;

DETAILED DESCRIPTION

Figure 2:
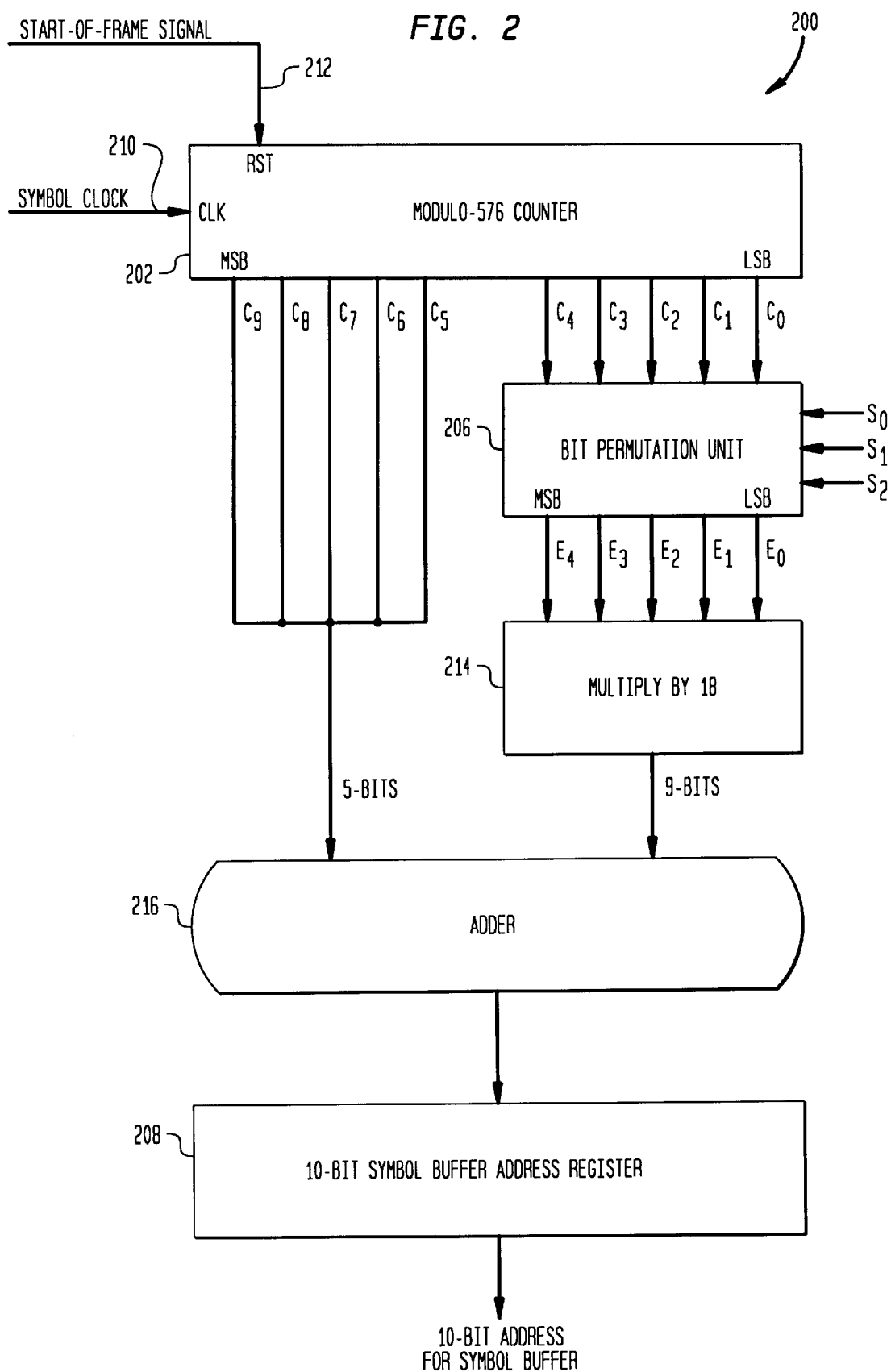
FIG. 2 shows a block diagram of an address generation unit for a cdmaOne reverse-link interleaver, according to one possible hardware embodiment of the present invention.

According to the present invention, the interleaving process applied to the reverse-link stream of un-interleaved symbols in a mobile unit in a cdmaOne telecommunication system corresponds to the implementation of closed-form expressions, rather than the table-based procedure of conventional cdmaOne systems. Depending on the particular embodiment, the closed-form expressions can be implemented in either hardware or software.

Closed-Form Expressions

This section presents closed-form expressions that relate the symbol positions in the un-interleaved stream to the symbol positions in the interleaved stream for the reverse-link Access and Traffic channels transmitted from the mobile units to the base stations of a cdmaOne telecommunication system. If $N_{IN}$ represents the symbol position in the un-interleaved stream and $N_{OUT}$ represents the symbol position in the interleaved stream, then a closed-form expression may be presented as follows:

$$N_{OUT} = F(N_{IN})$$

where $F(\ )$ represents the operations applied to the un-interleaved symbol position $N_{IN}$ to generate the interleaved symbol position $N_{OUT}$. The interleaved symbol position $N_{OUT}$ can be thought of as the buffer address for the interleaved symbol stream, where the buffer corresponds to a matrix located in the mobile unit that is equivalent to the matrix shown in FIG. 1.

For each frame, the symbols in the un-interleaved signal stream are counted sequentially from $N_{IN}$ equals 0 to 575. (Note that FIG. 1 shows the sequence of symbols running from 1 to 576, because this is how the interleaving patterns are specified in the cdmaOne standard.) The un-interleaved symbol position $N_{IN}$ can be represented by the 10-tuple ($c_9$, $c_8$, $c_7$, $c_6$, $c_5$, $c_4$, $c_3$, $c_2$, $c_1$, $c_0$), where the $c_i$'s are binary values, $c_9$ is the most significant bit (MSB) of $N_{IN}$, and $c_0$ is the least significant bit (LSB) of $N_{IN}$. As such, $N_{IN}$ can be represented by the 10-tuple ($c_9$, $c_8$, $c_7$, $c_6$, $c_5$, $c_4$, $c_3$, $c_2$, $c_1$, $c_0$), according to Equation (1) as follows:

$$N_{IN} = 2^9 c_9 + 2^8 c_8 + 2^7 c_7 30\ 2^6 c_6 + 2^5 c_5 2^4 c_4 + 2^3 c_3 + 2^2 c_2 + 2c_1 + c_0. \tag{1}$$

Access Channel

For the Access channel at 4800 bps, the interleaved symbol position $N_{OUT(ACCESS)}$ is given by Equation (2) as follows:

$$N_{OUT(ACCESS)} = 18 \times (2^4 c_0 + 2^3 c_1 + 2^2 c_2 + 2 c_3 + c_4) + \tag{2}$$
$$2^4 c_9 + 2^3 c_8 + 2^2 c_7 + 2 c_6 + c_5$$
$$= 2^9 d_9 + 2^8 d_8 + 2^7 d_7 + 2^6 d_6 + 2^5 d_5 + 2^4 d_4 +$$
$$2^3 d_3 + 2^2 d_2 + 2 d_1 + d_0$$

where $N_{OUT(ACCESS)}$ is represented by the 10-tuple ($d_9$, $d_8$, $d_7$, $d_6$, $d_5$, $d_4$, $d_3$, $d_2$, $d_1$, $d_0$).

Since $18=(16+2)=(2^{4+2})$, Equation (2) can be rewritten to yield Equation (2A) as follows:

$$N_{OUT(ACCESS)} = 2^4 \times (2^4 c_0 + 2^3 c_1 + 2^2 c_2 + 2 c_3 + c_4) + \tag{2A}$$
$$2 \times (2^4 c_0 + 2^3 c_1 + 2^2 c_2 + 2 c_3 + c_4) +$$
$$2^4 c_9 + 2^3 c_8 + 2^2 c_7 + 2 c_6 + c_5$$

Equation (2A) can be expanded and realigned to yield Equation (2B) as follows:

$$N_{OUT} = 2^8 c_0 + 2^7 c_1 + 2^6 c_2 + 2^5 c_3 + 2^4 c_4 + \tag{2B}$$
$$2^5 c_0 + 2^4 c_1 + 2^3 c_2 + 2^2 c_3 + 2 c_4 +$$
$$2^4 c_9 + 2^3 c_8 + 2^2 c_7 + 2 c_6 + c_5$$
$$= 2^9 d_9 + 2^8 d_8 + 2^7 d_7 + 2^6 d_6 + 2^5 d_5 + 2^4 d_4 + 2^3 d_3 +$$
$$2^2 d_2 + 2 d_1 + d_0$$

Using the alignment between the $c_i$ and $d_i$ terms in Equation (2B) provides the relationships of Equation (3) as follows:

$$d_0 = c_5 \tag{3}$$
$$d_1 = c_4 \oplus c_6 \qquad CR_1 = c_4 \cdot c_6$$
$$d_2 = c_3 \oplus c_7 \oplus CR_1 \qquad CR_2 = CR_1 \cdot c_3 + CR_1 \cdot c_7 + c_3 \cdot c_7$$
$$d_3 = c_2 \oplus c_8 \oplus CR_2 \qquad CR_3 = CR_2 \cdot c_2 + CR_2 \cdot c_8 + c_2 \cdot c_8$$
$$d_4 = c_1 \oplus c_4 \oplus c_9 \oplus CR_3 \qquad CR_4 = CR_3 \cdot c_1 + CR_3 \cdot c_4 + CR_3 \cdot c_9 +$$
$$\qquad\qquad c_1 \cdot c_4 + c_1 \cdot c_9 + c_4 \cdot c_9$$
$$d_5 = c_0 \oplus c_3 \oplus CR_4 \qquad CR_5 = CR_4 \cdot c_0 + CR_4 \cdot c_3 + c_0 \cdot c_3$$
$$d_6 = c_2 \oplus CR_5 \qquad CR_6 = CR_5 \cdot c_2$$
$$d_7 = c_1 \oplus CR_6 \qquad CR_7 = CR_6 \cdot c_1$$
$$d_8 = c_0 \oplus CR_7$$
$$d_9 = c_0 \cdot CR_7$$

where "$\oplus$" represents the logical "XOR" (i.e., exclusive OR) function, "$\cdot$" represents the logical "AND" function, and "+" represents the logical "OR" function. Note that because $N_{IN}$ is never greater than 575, when $c_9$ is 1, $c_8=c_7=c_6=0$. This fact can be exploited to simplify the hardware implementation of the present invention by recognizing that, if $c_9=1$, then $CR_3=0$ and $CR_3 \cdot c_9=0$ and, if $c_9=0$, then $CR_3 \cdot c_9=0$. Thus, the expression for $CR_4$ in Equation (3) can be simplified to be the following:

$$CR_4 = CR_3 \cdot c_1 + CR_3 \cdot c_4 + c_1 \cdot c_4 + c_9 \cdot c_9 + c_4 \cdot c_9.$$

Traffic Channel

For the Traffic channel at 9600 bps (or 14400 bps), the 10-tuple ($d_9$, $d_8$, $d_7$, $d_6$, $d_5$, $d_4$, $d_3$, $d_2$, $d_1$, $d_0$) for the interleaved symbol position $N_{OUT(9600)}$ is given by Equation (4) as follows:

$$N_{OUT(9600)} = 18 \times (2^4 c_4 + 2^3 c_3 + 2^2 c_2 + 2 c_1 + c_0) + 2^4 c_9 + 2^3 c_8 + 2^2 c_7 + 2 c_6 + c_5. \tag{4}$$

For the Traffic channel at 4800 bps (or 7200 bps), the 10-tuple ($d_9$, $d_8$, $d_7$, $d_6$, $d_5$, $d_4$, $d_3$, $d_2$, $d_1$, $d_0$) for the interleaved symbol position $N_{OUT(4800)}$ is given by Equation (5) as follows:

$$N_{OUT(4800)} = 18 \times (2^4 c_4 + 2^3 c_3 + 2^2 c_2 + 2 c_0 + c_1) + 2^4 c_9 + 2^3 c_8 + 2^2 c_7 + 2 c_6 + c_5. \tag{5}$$

The difference between $N_{OUT(9600)}$ and $N_{OUT(4800)}$ is that the two LSBs ($c_1$ and $c_0$) of $N_{IN}$ are interchanged.

In a similar manner, for the 2400-bps (or 3600-bps) Traffic channel, the three LSBs ($c_2$, $c_1$, and $c_0$) of $N_{IN}$ are cyclically interchanged to yield the interleaved symbol position $N_{OUT(2400)}$, which is given by the 10-tuple ($d_9$, $d_8$, $d_7$, $d_6$, $d_5$, $d_4$, $d_3$, $d_2$, $d_1$, $d_0$), which is equivalent to Equation (6) as follows:

$$N_{OUT(2400)} = 18 \times (2^4 c_4 + 2^3 c_3 + 2^2 c_1 + 2 c_0 + c_2) + 2^4 c_9 + 2^3 c_8 + 2^2 c_7 + 2 c_6 + c_5. \quad (6)$$

For the 1200-bps (or 1800-bps) Traffic channel, the four LSBs ($c_3$, $c_2$, $c_1$, and $c_0$) of $N_{IN}$ are cyclically interchanged to yield the interleaved symbol position $N_{OUT(1200)}$ which is given by the 10-tuple ($d_9$, $d_8$, $d_7$, $d_6$, $d_5$, $d_4$, $d_3$, $d_2$, $d_1$, $d_0$), which is equivalent to Equation (7) as follows:

$$N_{OUT(1200)} = 18 \times (2^4 c_4 + 2^3 c_2 + 2^2 c_1 + 2 c_0 + c_3) + 2^4 c_9 + 2^3 c_8 + 2^2 c_7 + 2 c_6 + c_5. \quad (7)$$

In general, for purposes of this specification, whatever applies to the 9600, 4800, 2400, and 1200-bps data rates of Rate Set 1 applies equally well to the 14400, 7200, 3600, and 1800-bps data rates, respectively, of Rate Set 2.

Each of the expressions for the four Traffic channels in Equations (4)–(7) can be represented in a manner analogous to that shown in Equation (3) for the Access channel expression in Equation (2).

Equations (2) and (4)–(7) are closed-form expressions corresponding to the interleaving process applied by a mobile unit to the un-interleaved symbol stream of the reverse-link Access and four Traffic channels, respectively, before transmission to a base station in a cdmaOne telecommunication system. These closed-form expressions can be implemented in either hardware or software or even a combination of hardware and software. Equations (2) and (4)–(7) can be generalized as a single closed-form expression given by Equation (8) as follows:

$$N_{OUT} = 18 \times (2^4 e_4 + 2^3 e_3 + 2^2 e_2 + 2 e_1 + e_0) + 2^4 c_9 + 2^3 c_8 + 2^2 c_7 + 2 c_6 + c_5 \quad (8)$$

where the $e_i$'s of Equation (8) are related to the $c_i$'s of Equations (2) and (4)–(7) for the different data channels as shown in Table I. (Control bits $s_0$, $s_1$, and $s_2$ will be described in the next section in relation to a possible hardware implementation of the present invention.)

TABLE I

REVERSE-LINK INTERLEAVER BIT PERMUTATION

| CHANNEL | $s_2$ | $s_1$ | $s_0$ | $e_4$ | $e_3$ | $e_2$ | $e_1$ | $e_0$ |
|---|---|---|---|---|---|---|---|---|
| Access | 1 | 1 | 1 | $c_0$ | $c_1$ | $c_2$ | $c_3$ | $c_4$ |
| 9600-bps or 14400-bps Traffic | 0 | 0 | 0 | $c_4$ | $c_3$ | $c_2$ | $c_1$ | $c_0$ |
| 14400-bps Traffic | 0 | 0 | 1 | $c_4$ | $c_3$ | $c_2$ | $c_0$ | $c_1$ |
| 2400-bps or 3600-bps Traffic | 0 | 1 | 0 | $c_4$ | $c_3$ | $c_1$ | $c_0$ | $c_2$ |
| 1200-bps or 1800-bps Traffic | 0 | 1 | 1 | $c_4$ | $c_2$ | $c_1$ | $c_0$ | $c_3$ |

Hardware Implementation

In one possible hardware implementation of the present invention, a reverse-link interleaver in the mobile unit of a cdmaOne telecommunication system comprises an address generation unit and a symbol buffer. The symbol buffer contains a maximum of 576 symbols corresponding to a frame in the reverse-link data stream. Each symbol is synchronized by a symbol clock. Each symbol is written into the symbol buffer at the address indicated by the output of the address generation unit (i.e., $N_{OUT}$). In addition, the interleaver knows the type of channel (i.e., Access or Traffic) and the data rate (i.e., 9600, 4800, 2400, or 1200 bps for Rate Set 1 and 14400, 7200, 3600, or 1800 bps for Rate Set 2). This information is used by the address generation unit to select the correct values of the control bits $s_0$, $s_1$, and $s_2$.

FIG. 2 shows a block diagram of an address generation unit 200 for a cdmaOne reverse-link interleaver, according to one possible hardware embodiment of the present invention. Address generation unit 200 receives a clock signal corresponding to the un-interleaved symbol position $N_{IN}$ for the current symbol in the current frame of the un-interleaved data stream and generates the appropriate corresponding interleaved symbol position $N_{OUT}$ for the specific data stream (i.e., either the Access channel or one of the four Traffic channels), which is used as the address for writing the symbol to the symbol buffer.

In particular, address generation unit 200 has a modulo-576 counter 202. The symbol clock 210 is synchronized with the start-of-frame signal 212, with the counter being reset to zero at the start of each frame. The five MSBs of the 10-bit output of modulo-576 counter 202 are treated as a 5-bit input to adder 216, while the five LSBs of the 10-bit output of modulo-576 counter 202 are input to bit permutation unit 206, whose 5-bit output feeds multiply-by-18 block 214. The operating mode of bit permutation unit 206 is selected based on the three control bits $s_0$, $s_1$, and $S_2$ from a controller (e.g., a digital signal processor or micro-controller). The operations of bit permutation unit 206 depend on the specific channel, as presented in Table I. The 9-bit output from multiply-by-18 block 214 is the second input to adder 216. The output from adder 216, which is stored in register 208 is a 10-bit address equal to the interleaved symbol position $N_{OUT}$ of Equation (8).

Although counter 202 is shown in FIG. 2 as being reset at the start of each frame, in general, the counter need only be reset at the start of the first frame and again at any other event that may require synchronization.

Although counter 202 is shown in FIG. 2 as a modulo-576 counter, since the start-of-frame signal is used as a reset signal for counter 202, counter 202 could be implemented as a "modulo-577" or higher counter instead of a modulo-576 counter. In general, the term "modulo-576 counter" as used in this specification may be interpreted as referring to any modulo-576 or higher counter, with the 10 LSBs of the counter output used to generate the address.

Figure 3:
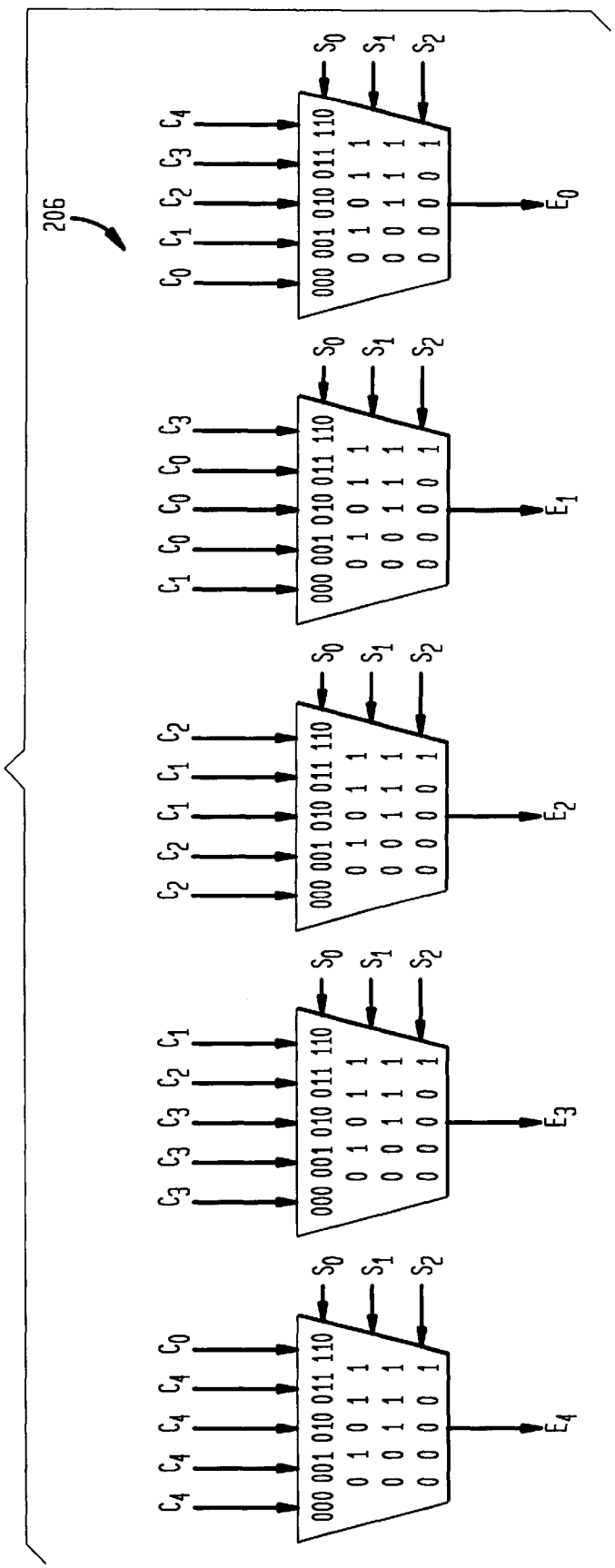
FIG. 3 shows a block diagram of the bit permutation unit of the address generation unit of FIG. 2, according to one possible embodiment of the present invention.

FIG. 3 shows a block diagram of bit permutation unit 206 of FIG. 2, according to one possible embodiment of the present invention. According to this embodiment, bit permutation 206 is implemented with five muxes 302, each of which receives five inputs selected from the five LSBs ($c_4$, $c_3$, $c_2$, $c_1$, $c_0$) generated by modulo-576 counter 204 of FIG. 2, as well as the three control bits $s_0$, $s_1$, and $S_2$, which determine which input appears at the output of the mux. Here, too, the operations of the five muxes 302 follow the bit permutation scheme presented in Table I.

As described, address generation unit 200 of FIG. 2 can be used to generate symbol buffer addresses to write data into buffer locations corresponding to the interleaved sequence. In that case, after the buffer is filled, the interleaved data can be read sequentially from the memory for subsequent processing. This is an example of what is referred to as write-interleave-read-linear processing. Those skilled in the art will understand that address generation unit 200 of FIG. 2 can also be used to perform write-linear-read-interleave processing, in which the data is written linearly into a symbol buffer and then read from the buffer using the buffer addresses generated by address generation unit 200 to yield the interleaved symbol stream for subsequent processing.

Although the present invention has been described in the context of one possible hardware implementation, it will be understood that other alternative hardware implementations corresponding to the closed-form expressions of Equations (2) and (4)–(7) are also possible. For example, the relationships of Equation (2) for the Access channel (and analogous relationships for the four Traffic channels) may be implemented as a ripple carry adder in integrated circuitry in a fairly straightforward manner using XOR, AND, and OR gates. Carry-look-ahead structures can also be used for faster operation of the circuit. Moreover, hardware embodiments can be implemented as part of an integrated circuit that also performs other mobile-unit functions. In addition, the expressions can be implemented in software or in a combination of hardware and software, as appropriate. Even if implemented entirely in software, embodiments corresponding to the closed-form expressions of Equations (3)–(7) are simpler than the table-based algorithms of existing systems.

Although the present invention has been explained in the context of cdmaOne communication systems, it will be understood that the present invention can also be implemented in the context of communication systems conforming to standards other than the cdmaOne family of communication standards.

It will be further understood that various changes in the details, materials, and arrangements of the parts which have been described and illustrated in order to explain the nature of this invention may be made by those skilled in the art without departing from the principle and scope of the invention as expressed in the following claims.

What is claimed is:

1. A method for interleaving a reverse-link channel of a communication system, comprising the steps of:

(a) receiving an un-interleaved symbol stream for the reverse-link channel;

(b) implementing, for each symbol in the un-interleaved symbol stream, a closed-form expression relating an un-interleaved symbol position for said each symbol to an interleaved symbol position in an interleaved symbol stream to generate the interleaved symbol position for said each symbol, wherein the closed-form expression corresponds to two or more different sets of mathematical operations being applied to two or more different sets of bits in a binary value representing the un-interleaved symbol position to generate bits in a binary value representing the interleaved symbol position, wherein:

the two or more different sets of mathematical operations comprise a first set of mathematical operations and a second set of mathematical operations different from the first set;

the first set of mathematical operations is applied to a first set of bits in the binary value representing the un-interleaved symbol position to generate a first partial result;

the second set of mathematical operations is applied to a second set of bits in the binary value representing the un-interleaved symbol position, different from the first set of bits, to generate a second partial result; and the first and second partial results are combined in generating bits in the binary value representing the interleaved symbol position; and (c) generating the interleaved symbol stream from the un-interleaved symbol stream using the interleaved symbol position for said each symbol.

2. The method of claim 1, wherein:

the closed-form expression is given by:

$$N_{OUT}=18\times(2^4 e_4+2^3 e_3+2^2 e_2+2e_1+e_0)+2^4 c_9+2^3 c_8+2^2 c_7+2c_6+c_5$$

wherein:

$N_{OUT}$ is the interleaved symbol position, an integer ranging from 0 to 575;

$N_{IN}$ is the un-interleaved symbol position, an integer ranging from 0 to 575 represented by a 10-tuple ($c_9$, $c_8$, $c_7$, $c_6$, $c_5$, $c_4$, $c_3$, $c_2$, $c_1$, $c_0$), where each element $c_{0-9}$ is an integer ranging from 0 to 1; and a 5-tuple ($e_4$, $e_3$, $e_2$, $e_1$, $e_0$) is related to a 5-tuple ($c_4$, $c_3$, $c_2$, $c_1$, $c_0$) by a bit permutation scheme that depends on the data rate of the reverse-link channel, where each element $e_{0-4}$ is an integer ranging from 0 to 1.

3. The method of claim 2, wherein:

if the reverse-link channel is a reverse-link Access channel, the closed-form expression for the interleaved symbol position $N_{OUT(ACCESS)}$ is given by:

$$N_{OUT(ACCESS)}=18\times(2^4 c_0+2^3 c_1+2^2 c_2+2c_3+c_4)+2^4 c_9+2^3 c_8+2^2 c_7+2c_6+c_5;$$

if the reverse-link channel is a reverse-link 9600-bps or 14400-bps Traffic channel, the closed-form expression for the interleaved symbol position $N_{OUT(9600)}$ is given by:

$$N_{OUT(9600)}=18\times(2^4 c_4+2^3 c_3+2^2 c_2+2c_1+c_0)+2^4 c_9+2^3 c_8+2^2 c_7+2c_6+c_5;$$

if the reverse-link channel is a reverse-link 4800-bps or 7200-bps Traffic channel, the closed-form expression for the interleaved symbol position $N_{OUT(4800)}$ is given by:

$$N_{OUT(4800)}=18\times(2^4 c_4+2^3 c_3+2^2 c_2+2c_0+c_1)+2^4 c_9+2^3 c_8+2^2 c_7+2c_6+c_5;$$

if the reverse-link channel is a reverse-link 2400-bps or 3600-bps Traffic channel, the closed-form expression for the interleaved symbol position $N_{OUT(2400)}$ is given by:

$$N_{OUT(2400)}=18\times(2^4 c_4+2^3 c_3+2^2 c_1+2c_0+c_2)+2^4 c_9+2^3 c_8+2^2 c_7+2c_6+c_5;$$

if the reverse-link channel is a reverse-link 1200-bps or 1800-bps Traffic channel, the closed-form expression for the interleaved symbol position $N_{OUT(1200)}$ is given by:

$$N_{OUT(1200)}=18\times(2^4 c_4+2^3 c_2+2^2 c_1+2c_0 c_3)+2^4 c_9+2^3 c_8+2^2 c_7+2c_6+c_5.$$

4. The method of claim 3, wherein the closed-form expression is implemented in software.

5. The method of claim 3, wherein the closed-form expression is implemented in hardware.

6. The method of claim 5, wherein the closed-form expression is implemented in a single integrated circuit.

7. The method of claim 6, wherein the closed-form expression is implemented in the single integrated circuit using XOR, AND, and OR gates.

8. The method of claim 5, wherein the hardware implementation comprises:

(1) a modulo-576 or higher counter adapted to generate the 10-tuple ($c_9$, $c_8$, $c_7$, $c_6$, $c_5$, $c_4$, $c_3$, $c_2$, $c_1$, $c_0$) from the un-interleaved symbol position;

(2) a bit permutation unit adapted to generate the 5-tuple ($e_4$, $e_3$, $e_2$, $e_1$, $e_0$) from the 5-tuple ($c_4$, $c_3$, $c_2$, $c_1$, $c_0$) based on the channel;

(3) a multiply-by-18 block adapted to multiply a value corresponding to the 5-tuple ($e_4$, $e_3$, $e_2$, $e_1$, $e_0$) by 18; and (4) an adder to add a value corresponding to a 5-tuple ($c_9$, $c_8$, $c_7$, $c_6$, $c_5$) and a value generated by the multiply-by-18 block to generate the interleaved symbol position.

9. The method of claim 8, wherein the bit permutation unit comprises five 5-input muxes, wherein:

bits from the 5-tuple ($c_4$, $c_3$, $c_2$, $c_1$, $c_0$) form the inputs to the five muxes; and three control bits corresponding to the channel determine which input appears at the output of each mux.

10. An interleaver for interleaving a reverse-link channel of a communication system, comprising:

(a) means for receiving an un-interleaved symbol stream for the reverse-link channel;

(b) means for implementing, for each symbol in the un-interleaved symbol stream, a closed-form expression relating an un-interleaved symbol position for said each symbol to an interleaved symbol position in an interleaved symbol stream to generate the interleaved symbol position for said each symbol, wherein the closed-form expression corresponds to two or more different sets of mathematical operations being applied to two or more different sets of bits in a binary value representing the un-interleaved symbol position to generate bits in a binary value representing the interleaved symbol position, wherein:

the two or more different sets of mathematical operations comprise a first set of mathematical operations and a second set of mathematical operations different from the first set;

the first set of mathematical operations is applied to a first set of bits in the binary value representing the un-interleaved symbol position to generate a first partial result;

the second set of mathematical operations is applied to a second set of bits in the binary value representing the un-interleaved symbol position, different from the first set of bits, to generate a second partial result; and the first and second partial results are combined in generating bits in the binary value representing the interleaved symbol position; and (c) means for generating an interleaved symbol stream from the un-interleaved symbol stream using the interleaved symbol positions.

11. The interleaver of claim 10, wherein:

the closed-form expression is given by:

$$N_{OUT}=18\times(2^4 e_4+2^2 e_3+2^2 e_2+2 e_1+e_0)+2^4 c_9+2^3 c_8+2^2 c_7+2 c_6+c_5$$

wherein:

$N_{OUT}$ is the interleaved symbol position, an integer ranging from 0 to 575;

$N_{IN}$ is the un-interleaved symbol position, an integer ranging from 0 to 575 represented by a 10-tuple ($c_9$, $c_8$, $c_7$, $c_6$, $c_5$, $c_4$, $c_3$, $c_2$, $c_1$, $c_0$), where each element $c_{0-9}$ is an integer ranging from 0 to 1; and a 5-tuple ($e_4$, $e_3$, $e_2$, $e_1$, $e_0$) is related to a 5-tuple ($c_4$, $c_3$, $c_2$, $c_1$, $c_0$) by a bit permutation scheme that depends on the data rate of the reverse-link channel, where each element $e_{0-4}$ is an integer ranging from 0 to 1.

12. The interleaver of claim 11, wherein:

if the reverse-link channel is a reverse-link Access channel, the closed-form expression for the interleaved symbol position $N_{OUT(ACCESS)}$ is given by:

$$N_{OUT(ACCESS)}=18\times(2^4 c_0+2^3 c_1+2^2 c_2+2 c_3 c_4)+2^4 c_9+2^3 c_8+2^2 c_7+2 c_6+c_5;$$

if the reverse-link channel is a reverse-link 9600-bps or 14400-bps Traffic channel, the closed-form expression for the interleaved symbol position $N_{OUT(9600)}$ is given by:

$$N_{OUT(9600)}=18\times(2^4 c_4+2^3 c_3+2^2 c_2+2 c_1+c_0)+2^4 c_9+2^3 c_8+2^2 c_7+2 c_6+c_5;$$

if the reverse-link channel is a reverse-link 4800-bps or 7200-bps Traffic channel, the closed-form expression for the interleaved symbol position $N_{OUT(4800)}$ is given by:

$$N_{OUT(4800)}=18\times(2^4 c_4+2^3 c_3+2^2 c_2+2 c_0+c_1)+2^4 c_9+2^3 c_8+2^2 c_7+2 c_6+c_5;$$

if the reverse-link channel is a reverse-link 2400-bps or 3600-bps Traffic channel, the closed-form expression for the interleaved symbol position $N_{OUT(2400)}$ is given by:

$$N_{OUT(2400)}=18\times(2^4 c_4+2^3 c_3+2^2 c_1+2 c_0+c_2)+2^4 c_9+2^3 c_8+2^2 c_7+2 c_6+c_5;$$

if the reverse-link channel is a reverse-link 1200-bps or 1800-bps Traffic channel, the closed-form expression for the interleaved symbol position $N_{OUT(1200)}$ is given by:

$$N_{OUT(1200)}=18\times(2^4 c_4+2^3 c_2+2^2 c_1+2 c_0+c_3)+2^4 c_9+2^3 c_8+2^2 c_7+2 c_6+c_5.$$

13. The interleaver of claim 12, wherein the closed-form expression is implemented in software.

14. The interleaver of claim 12, wherein the closed-form expression is implemented in hardware.

15. The interleaver of claim 14, wherein the closed-form expression is implemented in a single integrated circuit.

16. The interleaver of claim 15, wherein the closed-form expression is implemented in the single integrated circuit using XOR, AND, and OR gates.

17. The interleaver of claim 14, wherein the hardware implementation comprises:

(1) a modulo-576 or higher counter adapted to generate the 10-tuple ($c_9$, $c_8$, $c_7$, $c_6$, $c_5$, $c_4$, $c_3$, $c_2$, $c_1$, $c_0$) from the un-interleaved symbol position;

(2) a bit permutation unit adapted to generate the 5-tuple ($e_4$, $e_3$, $e_2$, $e_1$, $e_0$) from the 5-tuple ($c_4$, $c_3$, $c_2$, $c_1$, $c_0$) based on the channel;

(3) a multiply-by-18 block adapted to multiply a value corresponding to the 5-tuple ($e_4$, $e_3$, $e_2$, $e_1$, $e_0$) by 18; and (4) an adder to add a value corresponding to a 5-tuple ($c_9$, $c_8$, $c_7$, $c_6$, $c_5$) and a value generated by the multiply-by-18 block to generate the interleaved symbol position.

18. The interleaver of claim 17, wherein the bit permutation unit comprises five 5-input muxes, wherein:

bits from the 5-tuple ($c_4$, $c_3$, $c_2$, $c_1$, $c_0$) form the inputs to the five muxes; and three control bits corresponding to the channel determine which input appears at the output of each mux.

19. An integrated circuit having an interleaver for interleaving a reverse-link channel of a communication system, wherein the interleaver comprises:

(A) a symbol buffer; and
(B) an address generation unit adapted to generate symbol addresses for reading un-interleaved symbols from or writing interleaved symbols to the symbol buffer, wherein the address generation unit implements, for each symbol in an un-interleaved symbol stream, a closed-form expression relating an un-interleaved symbol position for said each symbol to an interleaved symbol position in an interleaved symbol stream to generate the interleaved symbol position for said each symbol, wherein the closed-form expression corresponds to two or more different sets of mathematical operations being applied to two or more different sets of bits in a binary value representing the un-interleaved symbol position to generate bits in a binary value representing the interleaved symbol position, wherein:
  the two or more different sets of mathematical operations comprise a first set of mathematical operations and a second set of mathematical operations different from the first set;
  the first set of mathematical operations is applied to a first set of bits in the binary value representing the un-interleaved symbol position to generate a first partial result;
  the second set of mathematical operations is applied to a second set of bits in the binary value representing the un-interleaved symbol position, different from the first set of bits, to generate a second partial result; and
  the first and second partial results are combined in generating bits in the binary value representing the interleaved symbol position.

20. The integrated circuit of claim 19, wherein:
the closed-form expression is given by:

$$N_{OUT}=18\times(2^4 e_4+2^3 e_3+2^2 e_2+2e_1+e_0)+2^4 c_9+2^3 c_8+2^2 c_7+2c_6+c_5$$

wherein:
  $N_{OUT}$ is the interleaved symbol position, an integer ranging from 0 to 575;
  $N_{IN}$ is the un-interleaved symbol position, an integer ranging from 0 to 575 represented by a 10-tuple ($c_9$, $c_8$, $c_7$, $c_6$, $c_5$, $c_4$, $c_3$, $c_2$, $c_1$, $c_0$), where each element $c_{0-9}$ is an integer ranging from 0 to 1; and
  a 5-tuple ($e_4$, $e_3$, $e_2$, $e_1$, $e_0$) is related to a 5-tuple ($c_4$, $c_3$, $c_2$, $c_1$, $c_0$) by a bit permutation scheme that depends on the data rate of the reverse-link channel, where each element $e_{0-4}$ is an integer ranging from 0 to 1.

21. The integrated circuit of claim 20, wherein:
if the reverse-link channel is a reverse-link Access channel, the closed-form expression for the interleaved symbol position $N_{OUT(ACCESS)}$ is given by:

$$N_{OUT(ACCESS)}=18\times(2^4 c_0+2^3 c_1+2^2 c_2+2c_3+c_4)+2^4 c_9+2^3 c_8+2^2 c_7+2c_6+c_5;$$

if the reverse-link channel is a reverse-link 9600-bps or 14400-bps Traffic channel, the closed-form expression for the interleaved symbol position $N_{OUT(9600)}$ is given by:

$$N_{OUT(9600)}=18\times(2^4 c_4+2^3 c_3+2^2 c_2+2c_1+c_0)+2^4 c_9+2^3 c_8+2^2 c_7+2c_6+c_5;$$

if the reverse-link channel is a reverse-link 4800-bps or 7200-bps Traffic channel, the closed-form expression for the interleaved symbol position $N_{OUT(4800)}$ is given by:

$$N_{OUT(4800)}=18\times(2^4 c_4+2^3 c_3+2^2 c_2+2c_0+c_1)+2^4 c_9+2^3 c_8+2^2 c_7+2c_6+c_5;$$

if the reverse-link channel is a reverse-link 2400-bps or 3600-bps Traffic channel, the closed-form expression for the interleaved symbol position $N_{OUT(2400)}$ is given by:

$$N_{OUT(2400)}=18\times(2^4 c_4+2^3 c_3+2^2 c_1+2c_0+c_2)+2^4 c_9+2^3 c_8+2^2 c_7+2c_6+c_5;$$

if the reverse-link channel is a reverse-link 1200-bps or 1800-bps Traffic channel, the closed-form expression for the interleaved symbol position $N_{OUT(1200)}$ is given by:

$$N_{OUT(1200)}=18\times(2^4 c_4+2^3 c_2+2^2 c_1+2c_0+c_3)+2^4 c_9+2^3 c_8+2^2 c_7+2c_6+c_5.$$

22. The integrated circuit of claim 21, wherein the closed-form expression is implemented using XOR, AND, and OR gates.

23. The integrated circuit of claim 21, wherein the address generation unit comprises:
  (1) a modulo-576 or higher counter adapted to generate the 10-tuple ($c_9$, $c_8$, $c_7$, $c_6$, $c_5$, $c_4$, $c_3$, $c_2$, $c_1$, $c_0$) from the un-interleaved symbol position;
  (2) a bit permutation unit adapted to generate the 5-tuple ($e_4$, $e_3$, $e_2$, $e_1$, $e_0$) from the 5-tuple ($c_4$, $c_3$, $c_2$, $c_1$, $c_0$) based on the channel;
  (3) a multiply-by-18 block adapted to multiply a value corresponding to the 5-tuple ($e_4$, $e_3$, e2, $e_1$, $e_0$) by 18; and
  (4) an adder to add a value corresponding to a 5-tuple ($c_9$, $c_8$, $c_7$, $c_6$, $c_5$) and a value generated by the multiply-by-18 block to generate the interleaved symbol position.

24. The integrated circuit of claim 23, wherein the bit permutation unit comprises five 5-input muxes, wherein:
  bits from the 5-tuple ($c_4$, $c_3$, $c_2$, $c_1$, $c_0$) form the inputs to the five muxes; and
  three control bits corresponding to the channel determine which input appears at the output of each mux.

25. The method of claim 1, wherein the closed-form expression is implementable without relying on any lookup tables.

26. The interleaver of claim 10, wherein the closed-form expression is implementable without relying on any lookup tables.

27. The integrated circuit of claim 19, wherein the closed-form expression is implementable without relying on any lookup tables.

* * * * *